(12) United States Patent
Stuebing et al.

(10) Patent No.: US 7,646,265 B2
(45) Date of Patent: Jan. 12, 2010

(54) BAW RESONATOR FILTER BANDWIDTH AND OUT-OF-BAND FREQUENCY REJECTION

(75) Inventors: Carlton Stuebing, Portland, OR (US); Guillaume Bouche, Beaverton, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 98 days.

(21) Appl. No.: 11/734,188

(22) Filed: Apr. 11, 2007

(65) Prior Publication Data

US 2008/0252397 A1    Oct. 16, 2008

(51) Int. Cl.
*H03H 9/00* (2006.01)
(52) U.S. Cl. ...................... 333/189; 333/133
(58) Field of Classification Search ................ 333/133, 333/189, 193, 333
See application file for complete search history.

(56) References Cited

U.S. PATENT DOCUMENTS 5,392,011 A * 2/1995 Li ............................. 333/174
6,097,269 A * 8/2000 Hernandez ................. 333/174
2007/0030096 A1 * 2/2007 Nishihara et al. ........... 333/133

OTHER PUBLICATIONS

Lakin, K.M., et. al., Thin Film Bulk Acoustic Wave Filters for GPS, TFR Technologies, Inc., 1992, Ultrasonics Symposium.
Ruby, R., PCS 1900MHz Duplexer Using Thin Film Bulk Acoustic Resonators (FBARs), May 13, 1999, Electronics Letters, vol. 35, No. 10.
Penunuri, David, et. al., RF Filter Design Using LTCC and Thin Film BAW Technology, Motorola and TFR Technology, Inc., 2001, IEEE Ultrasonics Symposium.
Lakin, K.M., et. al., Improved Bulk Wave Resonator Coupling Coefficient for Wide Bandwidth Filters, TFR Technologies, Inc., Oct. 9, 2001, Ultrasonics Symposium Paper.

* cited by examiner

*Primary Examiner*—James Cho
(74) *Attorney, Agent, or Firm*—North Weber & Baugh LLP

(57) ABSTRACT

Embodiments of the present invention provide systems, devices and methods for improving both the bandwidth of a BAW resonator bandpass filter and the suppression of out-of-band frequencies above the passband. In various embodiments of the invention, blocker inductors are located in series between the filter input and the filter output to realize both bandwidth enhancement and improved out-of-band frequency rejection. For example, a first blocker inductor may be located at the input and a second blocker inductor may be located at the output of a BAW resonator bandpass filter.

42 Claims, 10 Drawing Sheets

510

520

610

620

710

720

810

820

BAW RESONATOR FILTER BANDWIDTH AND OUT-OF-BAND FREQUENCY REJECTION

BACKGROUND

A. Technical Field

The present invention relates generally to the design of bulk acoustic wave (hereinafter, "BAW") filters, and more particularly, to the implementation of "blocker inductors" within a BAW resonator filter to improve bandwidth and suppress above band signals with the filter.

B. Background of the Invention

Resonator technology is known within the art and has been previously implemented within electrical circuit designs. Resonant elements have been used within integrated circuits such as voltage controlled oscillators, reference oscillators and filters. Examples of these resonant elements include crystal resonators, BAW resonators and surface acoustic wave (hereinafter, "SAW") resonators. BAW and SAW resonators may be used in certain passive high-performance filter designs and implemented in various topologies such as lattice and ladder configurations. One skilled in the art will recognize the advantages of employing resonator elements within these high-frequency filters.

BAW resonators are considered to provide relatively good power handling and exhibit low frequency drift with temperature. A BAW resonator comprises a piezoelectric material that is placed between two electrodes. A BAW resonator piezoelectric layer may be made of various types of material known within the art. A BAW resonator may be manufactured using various techniques and structures including thin film bulk acoustic resonators ("FBARs") and solidly mounted resonators ("SMR").

The BAW resonator structure is deformed when an electric field is applied across the electrodes of the piezoelectric resonator. At certain frequencies, the BAW resonator may function as an electrical short, or a path with relatively low impedance, while at other frequencies the BAW resonator may exhibit very high impedance or function as a parallel plate capacitor.

The resonant behavior of a BAW resonator is a result of the conversion of electrical energy to acoustic energy, and the propagation of the acoustic energy across the piezoelectric material within the BAW. For example, at frequencies significantly below the resonant frequency, the efficiency of this conversion is low because the wavelength of the acoustic wave is larger than the thickness of the piezoelectric material, which results in propagation of this acoustic energy being substantially prevented. Comparatively, at frequencies significantly higher than the resonator frequency, there is very little excitation of acoustic waves in the piezoelectric layer resulting in these higher frequencies being largely blocked by the resonator.

A BAW resonator has a resonant frequency which is typically related to the thickness of the stack of piezoelectric material, associated metal end plates, shunt loading and if needed oxide layer. At frequencies at and around the resonant frequency, the piezoelectric layer is able to provide effective electro-acoustic conversion and efficiently propagate the acoustic energy through the resonator. These resonant frequencies help to define the bandwidth of a BAW resonator bandpass filter.

FIG. 1 illustrates an exemplary bandpass filter in which a plurality of BAW resonators in a ladder configuration is implemented. As shown, a first series BAW resonator 110, a second series BAW resonator 120, and a third series BAW resonator 130 are coupled in series between an input 105 and an output 135. A first shunt BAW resonator 140 and first helper inductor ($L_1$) 170 are coupled between the first BAW resonator 110 and the second BAW resonator 120, and ground 180. A second shunt BAW resonator 150 and second helper inductor ($L_2$) 175 are coupled between the second BAW resonator 120 and the third BAW resonator 130, and ground 180.

The first helper inductor ($L_1$) 170 and the second helper inductor ($L_2$) 175 are used to enhance the bandwidth of the filter and improve out-of-band rejection. This out-of-band rejection is improved by utilizing the parasitic capacitance ("$C_p$") of the corresponding BAW resonator above its parallel resonant frequency ("$F_p$") and may constitute a third shorting or series resonance above the passband defined at:

$$F=1/(2\Pi*SQRT(C_p*L_{helper}))$$

Comparatively, a third resonant frequency may also be established below the passband using the helper inductors defined at:

$$F=1/(2\Pi*SQRT((C_p+C_m)*L_{helper}))$$

where "$C_m$" is the piezoelectric equivalent capacitance of the resonator.

These "third" resonant frequencies add an additional frequency rejection notch or trap that improves the rejection of corresponding out-of-band frequencies within the BAW resonator filter.

The BAW resonator functions by receiving a signal at the input 105, and depending on its frequency, a path through the resonators is defined. If the signal frequency falls within the bandpass, then the signal is transmitted through the first, second and third series BAW resonators 110, 120, and 130 to the output 135 of the filter. At the frequency edges of this bandpass, notches are defined in which frequencies are strongly filtered. At the lower stop band, the shunt resonators short out the signal path, while at the upper stop band, the series resonators are open and therefore block the signal path. Frequencies beyond these edges (i.e., frequencies outside of the passband) are attenuated and filtered by the resonator configuration at varying levels. The depth, slope and width of these notches and attenuation of out-of-band frequencies, depend on the electrical characteristics of the resonators and the helper inductors implemented within the filter design.

The performance requirements of BAW resonator filters are becoming increasingly demanding as these types of filters are applied to different technologies and markets. The width of the filter's bandpass and the rejection characteristics of frequencies outside of this bandpass are oftentimes critical in meeting the performance requirements of a BAW resonator filter specification.

SUMMARY OF THE INVENTION

Embodiments of the present invention provide systems, devices and methods for improving both the bandwidth of a BAW resonator bandpass filter and the suppression of out-of-band frequencies above the passband. In various embodiments of the invention, blocker inductors are located in series between the filter input and the filter output to realize both bandwidth enhancement and improved out-of-band frequency rejection. For example, a first blocker inductor may be located at the input and a second blocker inductor may be located at the output of a BAW resonator bandpass filter.

Helper inductors can form band-limited frequency notches outside of the passband by resonating with the parasitic parallel plate capacitance of a BAW resonator, which may be designed to reject out-of-band frequencies. Blocker inductors are designed to supplement this out-of-band rejection by creating sustained low pass characteristics well above the passband (ignoring parasitic winding capacitance and mutual inductor of these devices). These inductors can reduce gain significantly at higher frequencies. Blocker inductors may also be used to improve the effective $K_{eff}^2$ of a resonator element or elements which result in allowing expansion of the bandwidth of the BAW resonator filter without compromising in-band return loss and passband ripple. In particular, the blocker inductors increase the frequency spacing of the series resonator $F_p$ and effective $F_s$, allowing a wider filter bandwidth to be designed without compromising in-band return loss or passband ripple.

The insertion of a blocker inductor at an input or output within a BAW filter results in this expansion of designable bandwidth. This is related to the improvement in the ratio of $F_p$ over effective $F_s$ of the series device, because the designable bandwidth of the bandpass filter is approximately given by the $F_p$ of the series resonator minus the effective $F_s$ of the shunt resonator given that the $F_p$ of the shunt resonator (which scales the associated shunt resonator $F_s$ value) is chosen be equal to approximately the effective $F_s$ of the series resonator. In certain embodiments of the invention, this useful bandwidth of the BAW resonator improves relative to a ratio of the inductance of the blocker inductor over the inductance of the internal resonator inductance ($L_m$).

One skilled in the art will recognize that blocker inductors may be structurally inserted at various locations within a series path of a BAW resonator filter. The location of these blocker inductors may be positioned so as to minimize problematic cross-coupling caused by induced current within the blocker inductors and helper inductors. The blocker inductors may also improve the insertion loss and return loss of impedance transforming BAW filter designs. Depending on the design of the BAW resonator filter, the manufacturability of the filter may also be improved by the inclusion of blocker inductors, such as the case of Code Division Multiple Access ("CDMA") filters.

According to various embodiments of the invention, blocker inductors may be included within different BAW resonator configurations including ladder resonator filters and Pi resonator network filters. Additionally, various embodiments of the invention may be realized using different types of resonator technologies known to one of skill in the art including film bulk acoustic wave resonator ("FBAR"), solidly mounted resonators ("SMR"), and coupled resonator filters ("CRF").

Certain features and advantages of the present invention have been generally described in this summary section; however, additional features, advantages, and embodiments are presented herein or will be apparent to one of ordinary skill in the art in view of the drawings, specification, and claims hereof. Accordingly, it should be understood that the scope of the invention shall not be limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

Embodiments of the present invention provide systems, devices and methods for improving both the bandwidth of a BAW resonator bandpass filter and the suppression of out-of-band frequencies above the passband. In various embodiments of the invention, blocker inductors are located in series between the filter input and the filter output to realize both bandwidth enhancement and improved out-of-band frequency rejection. For example, a first blocker inductor is located at the input and a second blocker inductor is located at the output of a BAW resonator bandpass filter.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different electrical components, circuits, devices and systems. The embodiments of the present invention may function in various different types of environments wherein impedance matching is relevant including high frequency RF applications. Structures and devices shown below in block diagram are illustrative of exemplary embodiments of the invention and are meant to avoid obscuring the invention. Furthermore, connections between components within the figures are not intended to be limited to direct connections. Rather, connections between these components may be modified, re-formatted or otherwise changed by intermediary components.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

Figure 1:
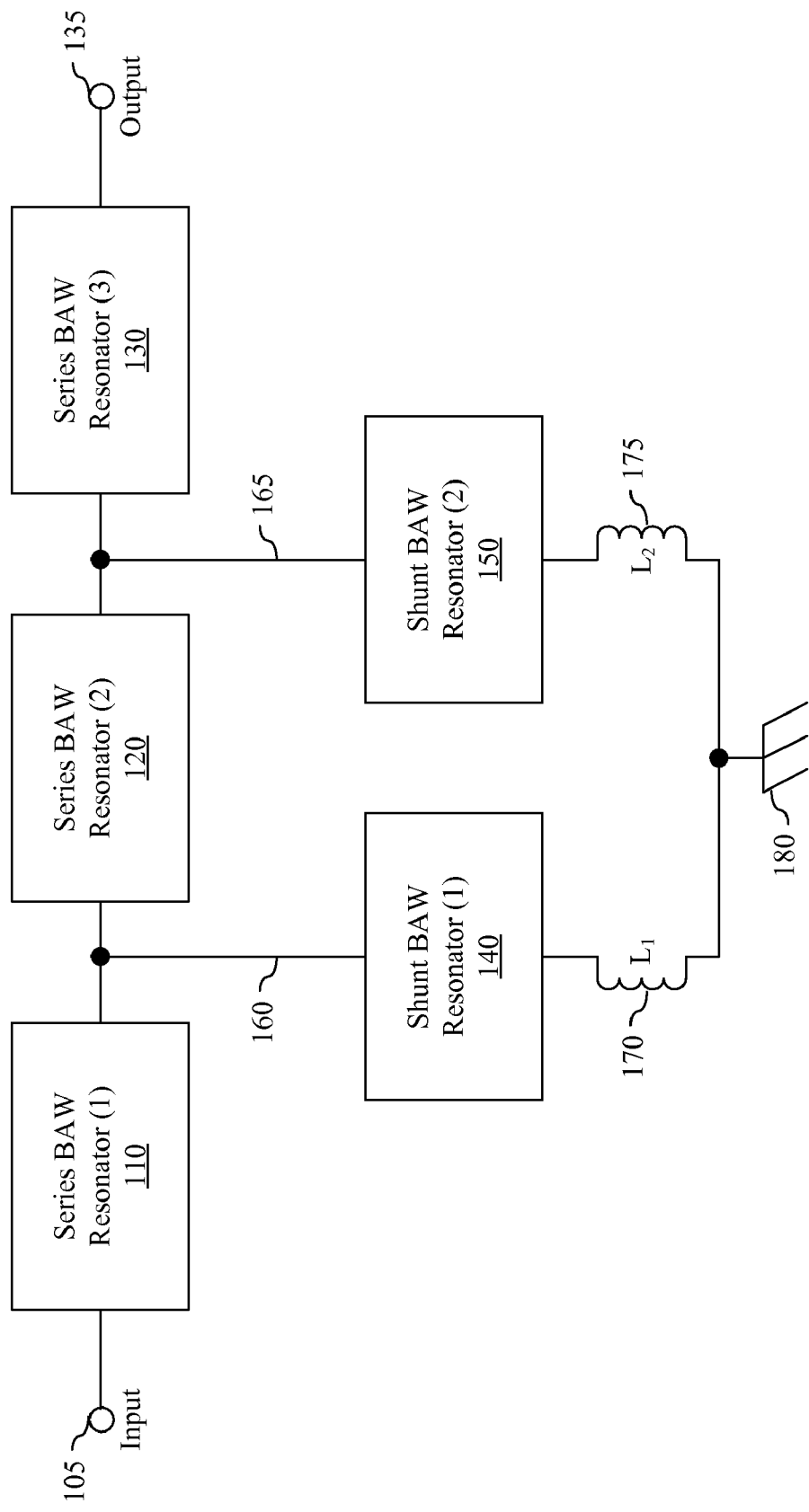
FIG. 1 illustrates a BAW resonator bandpass filter implementing a ladder configuration.
Figure 2:
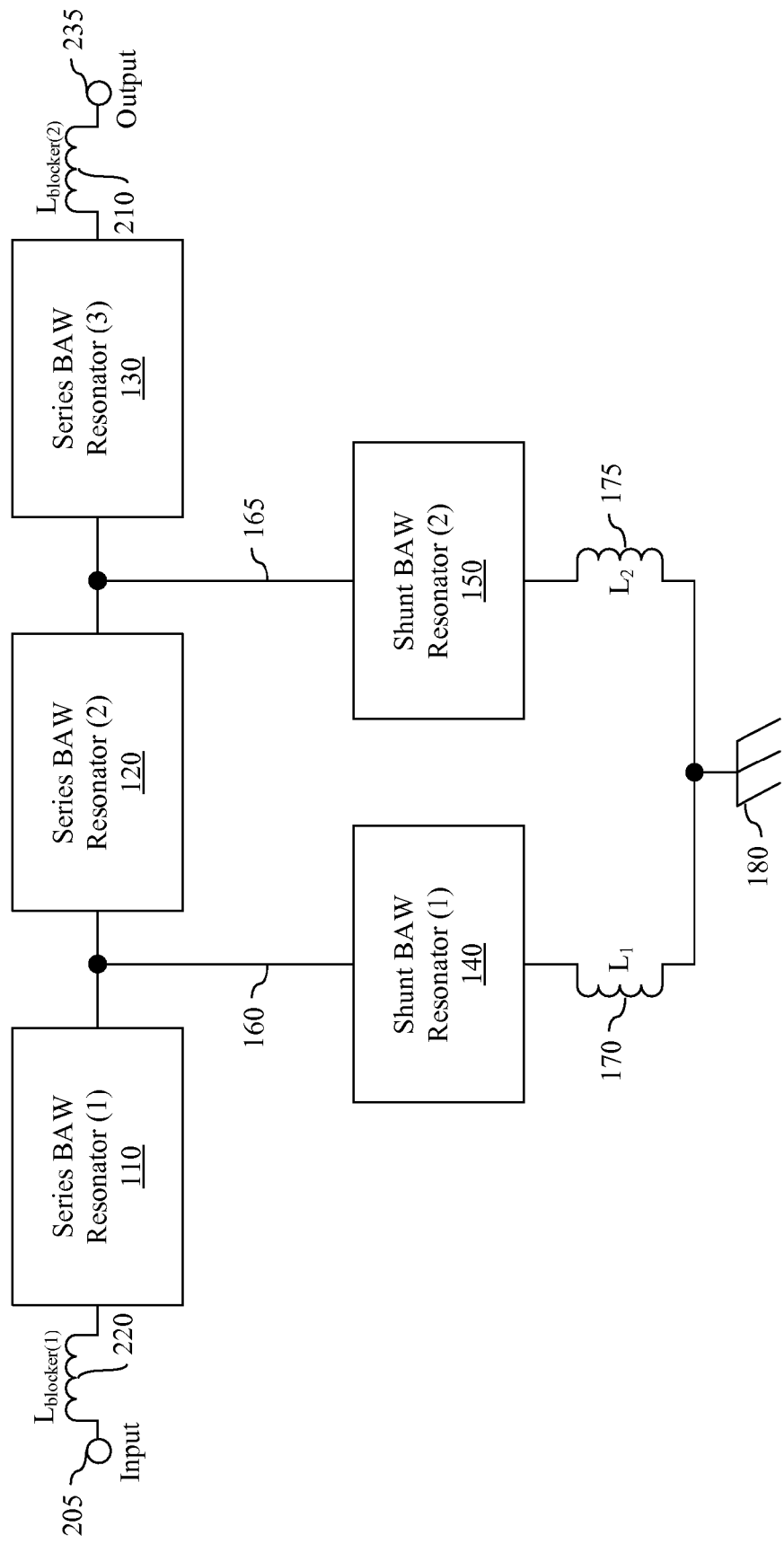
FIG. 2 is a general illustration of a BAW resonator bandpass filter having blocker inductors at the filter input and output according to various embodiments of the invention.

FIG. 2 illustrates an improved BAW resonator bandpass filter comprising blocker inductors according to various embodiments of the invention. As shown the first, second and third series BAW resonators 110, 120, and 130 are coupled between the input 205 and the output 235 of the filter. The first shunt BAW resonator 140 and first helper inductor 170 are coupled in series between the output of the first series BAW resonator 110 and ground 180. The second shunt BAW resonator 150 and second helper inductor 175 are coupled in series between the output of the second series BAW resonator 120 and ground 180. A first blocker inductor ($L_{blocker(1)}$) 220 is coupled at the input 205 of the filter and a second blocker inductor ($L_{blocker(2)}$) 210 is coupled at the output 235 of the filter. One skilled in the art will recognize that intermediary components may be positioned between the input/output port and the blocker inductor.

The first and second blocker inductors 220, 210 are designed to improve the rejection of frequencies above the passband and allow the design to expand the bandwidth of the filter without compromising passband ripple and return loss. In one embodiment of the invention, 3 nH blocker inductors were used in the filter. The 3 nH inductors have 6 GHz impedances of j113Ω which results in a total of j226Ω if blocker inductors are positioned at the filter input and output. Assuming 50Ω port impedances, this particular embodiment provides a significant reduction in gain for frequencies significantly above 6 GHz.

Although illustrated as being at the input and output ports, blocker inductors may be located anywhere along the series path of the BAW resonator bandpass filter. Furthermore, the number of blocker inductors within the filter may vary depending on design parameters and performance requirements. In theory, a blocker inductor may be included with each series BAW resonator; however, it is often less practical to include so many blocker resonators within the filter. The function of these blocker inductors is illustrated in relation to a functional model of a single BAW resonator element, such as the modified Butterworth Van Dyke Model.

Figure 3A:
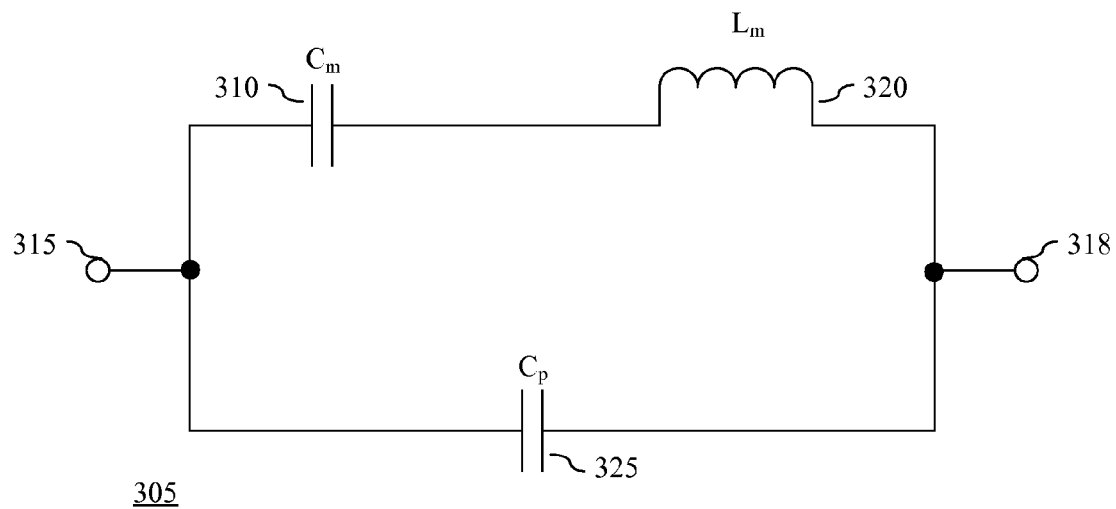
FIG. 3A is a block diagram of a modified Butterworth Van Dyke Model of a BAW resonator.

FIG. 3A illustrates a modified Butterworth Van Dyke circuit representation of a BAW resonator. The modified Butterworth Van Dyke Model 305 comprises a series resonant path and a parallel resonant loop between an input 315 and an output 318. The series resonant path comprises a series piezoelectric capacitor ($C_m$) 310 and a series piezoelectric inductor ($L_m$) 320 and may also include a resistor (not shown) representative of the equivalent resistance of the series capacitor ($C_m$) 310 and series inductor ($L_m$) 320. The parallel resonant loop comprises a parasitic parallel plate capacitor ($C_p$) 325, a series piezoelectric capacitor ($C_m$) 310 and a series piezoelectric inductor ($L_m$) 320. This loop may include other parasitic elements, such as the equivalent parasitic resistance of parasitic parallel plate capacitor ($C_p$) 325 and the equivalent resistance of the series capacitor ($C_m$) 310 and series inductor ($L_m$) 320.

The series resonant path defines a path in which the impedance quickly drops to a typically small minimum resistance value (denoted as the resistive component on that path) at a frequency ($F_s$) where the series inductance and series capacitance cancel. At this series resonant frequency, a low-impedance path from the input 315 to the output 318 is created.

At frequencies significantly lower than the series resonance, the impedances of the series and shunt resonators in a ladder filter such as FIG. 2 are capacitive, forming a "Tee" network which attenuates the signal at various levels. The capacitance of each resonator is given by the respective $C_m+C_p$ values, since $L_m$ is nearly a short circuit. At frequencies significantly higher than the parallel resonance, the impedance of $L_m$ 320 increases significantly resulting in the impedance of the resonator being dominated by parasitic parallel plate capacitance $C_p$ 325. For frequencies at the parallel resonance, current will effectively travel around the loop instead of being transmitted from the input 315 and out the output 318, so the resonator acts as an open circuit at $F_p$.

For high-Q resonators, the loss terms are typically small which reduces the insertion loss of the resonator. This loss is typically related to the piezoelectric losses of the model equivalent series capacitor 310 and the series inductor 320, as well as losses associated with the parallel plate capacitance, including dielectric loss. The series path losses relating to Qs are also related to parasitic resistance in the metal interconnecting the resonators. One skilled in the art will recognize that at resonant frequencies, the Model defines a low impedance peak and high impedance notch. A configuration of the resonators may be designed so that shunt loaded and series BAW resonators combinations of this peak and notch are used to define a passband of a bandpass filter. However, as previously described, the bandwidth of the passband and the out-of-band frequency rejection may still be unable to meet certain performance requirements of a BAW resonator filter.

Figure 3B:
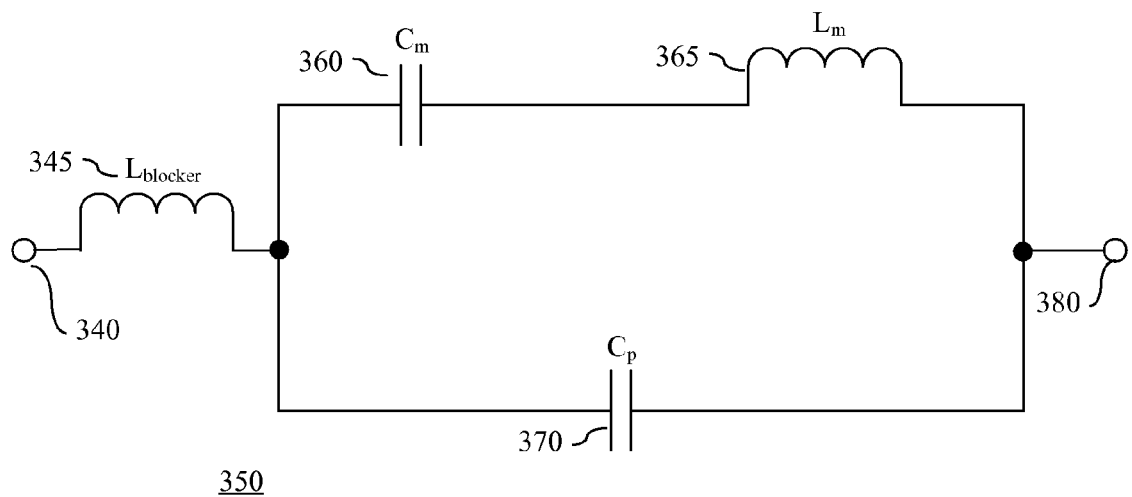
FIG. 3B is a block diagram of a modified Butterworth Van Dyke Model of a BAW resonator with a blocker inductor comprising a compound series resonator according to various embodiments of the invention.

FIG. 3B illustrates a modified Butterworth Van Dyke resonator model in which a blocker inductor is added to reduce the series resonant (or shorted) frequency without affecting the higher parallel resonant (or open) frequency. As a result, the bandwidth and out-of-band rejection of BAW resonator filter using this modified BAW resonator may be improved.

According to various embodiments of the invention, a blocker inductor 345 is located at the input 340 of the series BAW resonator. As a result, the series resonant path comprises the blocker inductor ($L_{blocker}$) 345, a series capacitor ($C_m$) 360 and series inductor ($L_m$) 365. Note that the series resistance will also change relative to the loss of the blocker inductor ($L_{blocker}$) 345. Also, the parallel resonant path in the Model still comprises the parallel capacitance ($C_p$) 370, a series capacitor ($C_m$) 360 and series inductor ($L_m$) 365.

The inclusion of the blocker inductor 345 is able to allow the expansion of the bandwidth that the compound BAW resonator (which is BAW plus series inductor as in FIG. 3B) can support by improving its equivalent $K_{eff}^2$. The compound resonator $K_{eff}^2$ of the resonator relates to the series resonant frequency ($F_s$), parallel resonant frequency ($F_p$) of the resonator and $K_{eff}^2$, all of which are defined as:

$$F_{seq}=1/2\Pi*SQRT((L_m+L_{blocker})*C_m)$$

$$F_p=1/2\Pi*SQRT(L_m*C_p*C_m/(C_p+C_m))$$

such that compound resonator $K_{eff}^2$ is defined as:

$$K_{eff}^2=\Pi^2*(F_p/F_{seq}-1)/4$$

where $F_{seq}$ is defined as the $F_s$ equivalent of the combination of the series inductor and the BAW resonator.

This assumes for simplicity that the filter shunt resonators utilize helper inductors which scale to the respective $L_m$ the same as $L_{blocker}$ scales to its respective $L_m$.

The insertion of the blocker inductor 345 improves the compound resonator $K_{eff}^2$ by $SQRT(1+L_{blocker}/L_m)$. This improvement in $K_{eff}^2$ expands the bandwidth capability of a filter implemented using a compound resonator 350 with the blocker inductor 345. Furthermore, even in the worst case ladder filter implementation where all shunt resonators have large helper inductors, not providing significant attenuation of signals above the associated trap frequencies, the series blocker inductor is very helpful.

The blocker inductor 345 can define a simple pole or low pass characteristic within the filter transfer function, which may be used to improve the out-of-band rejection of a filter using the modified compound series BAW resonator. At very high frequencies, the series resonators function as being nearly short circuits and the shunt helper inductors as being nearly open circuits. The total inductance of the series blocker inductors defines a simple low pass series RLR pole, where the R is the resistance of source and load termination impedances and L is the total series blocker inductance in series resonators cascaded within the filter. If a shunt resonator in a filter is connected directly to ground (thus having negligible grounding leg helper inductance), the high frequency low pass becomes even stronger as a series L shunt C, pi configuration series L, shunt C, series L, or similar. One skilled in the art will recognize that various filter designs may be employed to take advantage of the blocker inductor. Furthermore, one skilled in the art will recognize that the location of one or more blocker inductors within a multi-BAW resonator filter may be modified depending on the design of the filter itself.

Figure 4:
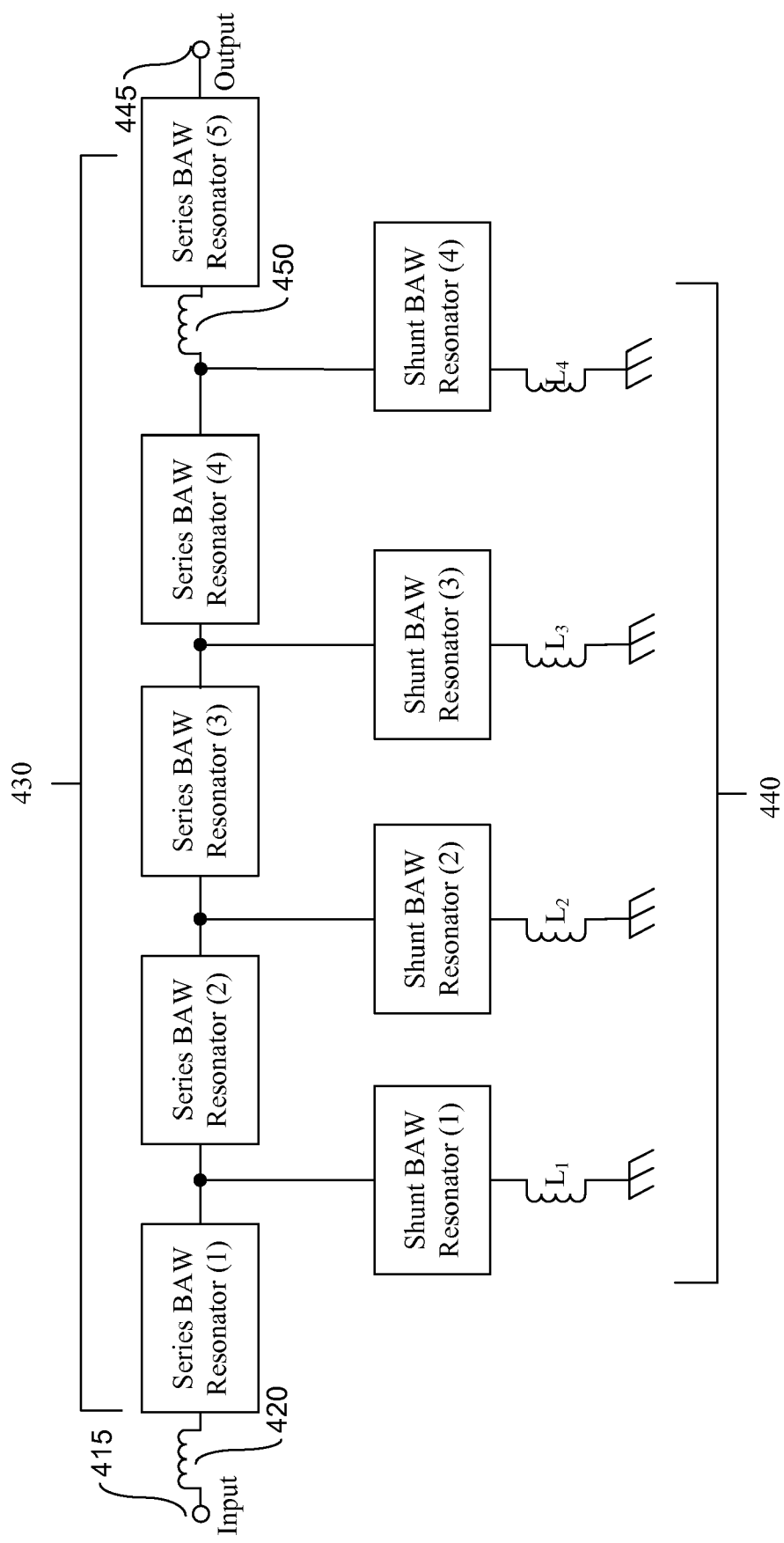
FIG. 4 illustrates a BAW resonator filter implementing five series resonators and two blocker inductors according to various embodiments of the invention.

FIG. 4 illustrates an exemplary BAW resonator filter in which the filter is realized using a ladder configuration and blocker inductors at its input and output in accordance with various embodiments of the invention. A BAW resonator filter is shown having a plurality of series BAW resonators 430 and a plurality of shunt BAW resonators 440 located between an input 415 and an output 445. A first blocker inductor 420 is coupled between the input 415 and the first series BAW resonator. A second blocker inductor 450 is coupled between the last series BAW resonator and the last shunt BAW resonator (5). One skilled in the art will recognize that other embodiments of the present invention provide for the inductor blockers to be serially coupled in other locations within the filter. Furthermore, the number of blocker inductors used within the filter may be increased.

Figure 5A:
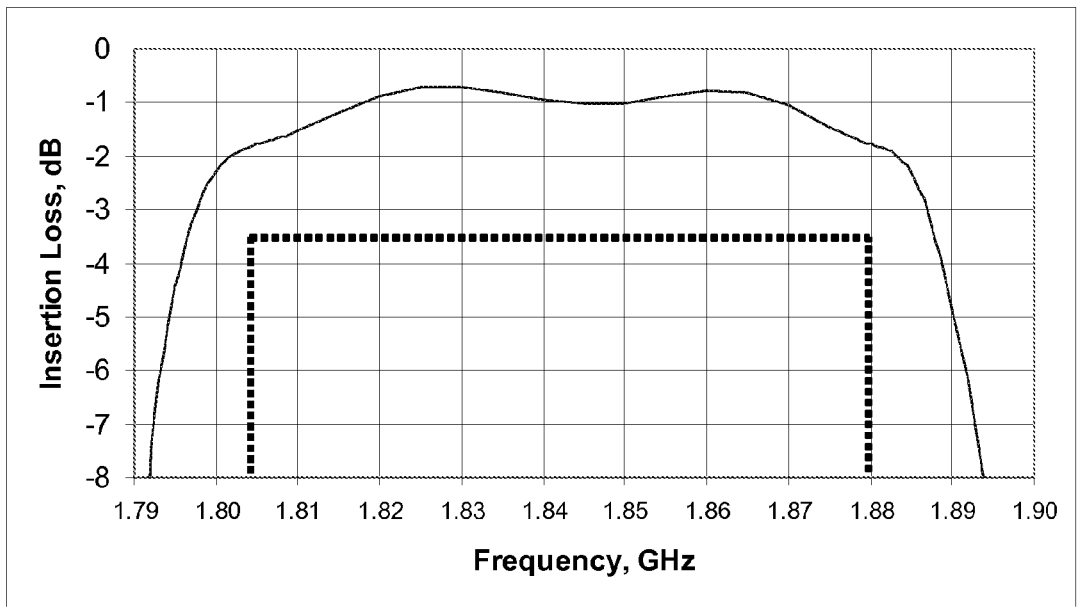
FIGS. 5A and 5B are representative plots of insertion loss of a prior art BAW resonator filter and a BAW resonator filter with blocker inductors implemented in accordance with various embodiments of the invention.
Figure 5B:
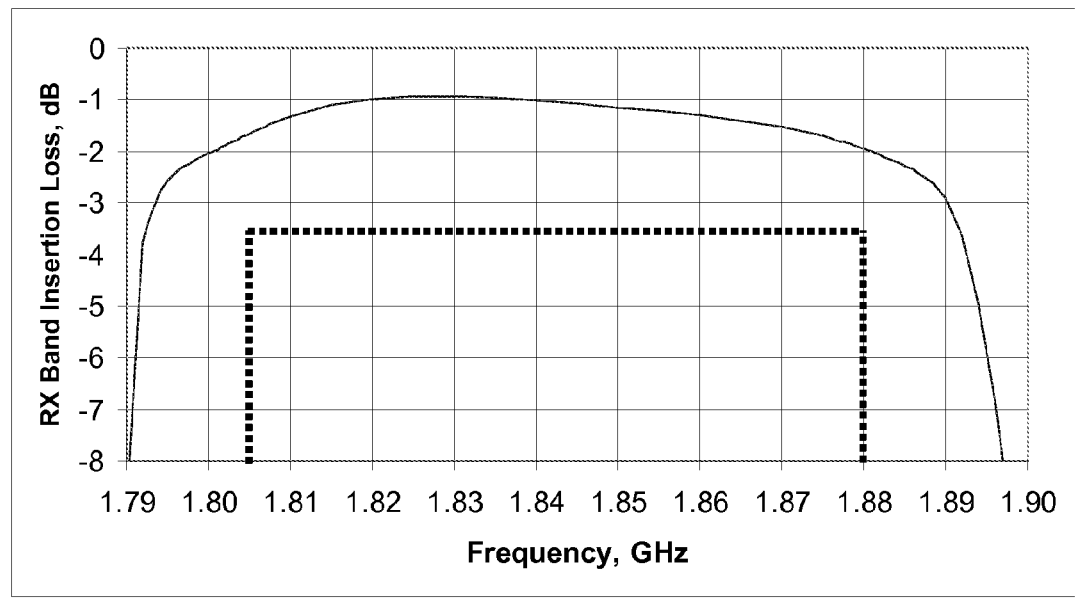

As will be shown, the first and second blocker inductors 420, 450 increase the bandwidth of the filter, improve rejection of out-of-band frequencies, and/or improve insertion and return loss. Referring to FIG. 5A, a simulation plot 510 is shown of insertion loss across a BAW resonator filter without the blocker inductors 420, 450. One skilled in the art will recognize that a passband of approximately 90 MHz at 3.5 dB is defined with only about 15 MHz margin from trim and drift. Comparatively, FIG. 5B shows a simulation plot 520 of insertion loss across the filter with the blocker inductors 420, 450. In this case, a passband of approximately 100 MHz at 3.5 dB is provided with a margin of about 25 MHz for trim and drift. The use of the first blocker inductor 240 and the second blocker inductor 250 improves the bandwidth at 2 dB by approximately 10 MHz out of 15 MHz bandwidth margin.

Figure 6A:
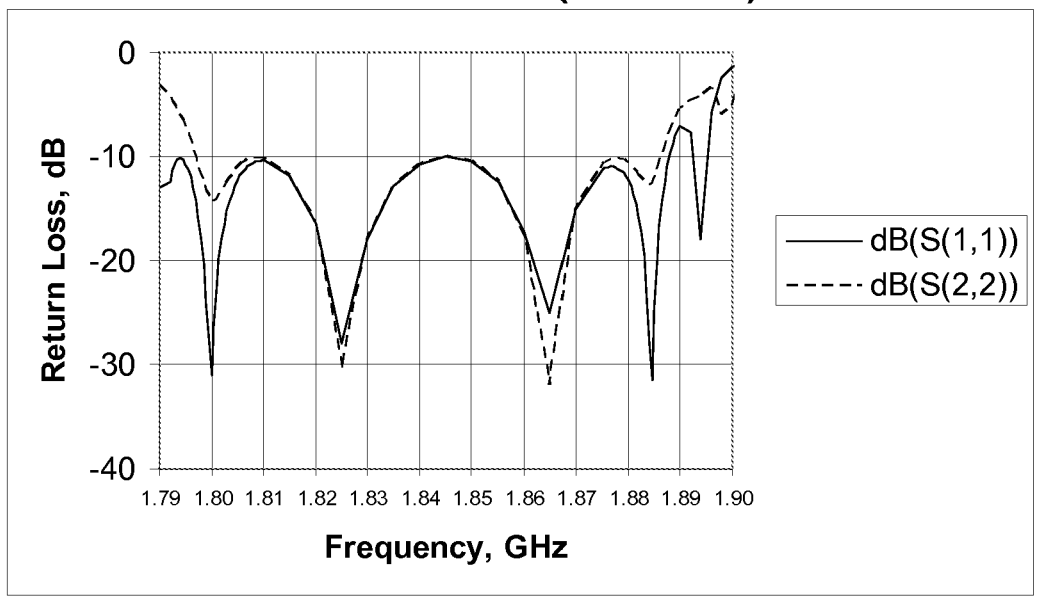
FIGS. 6A and 6B are representative plots of return loss of a prior art BAW resonator filter and BAW resonator filter blocker inductors implemented in accordance with various embodiments of the invention.
Figure 6B:
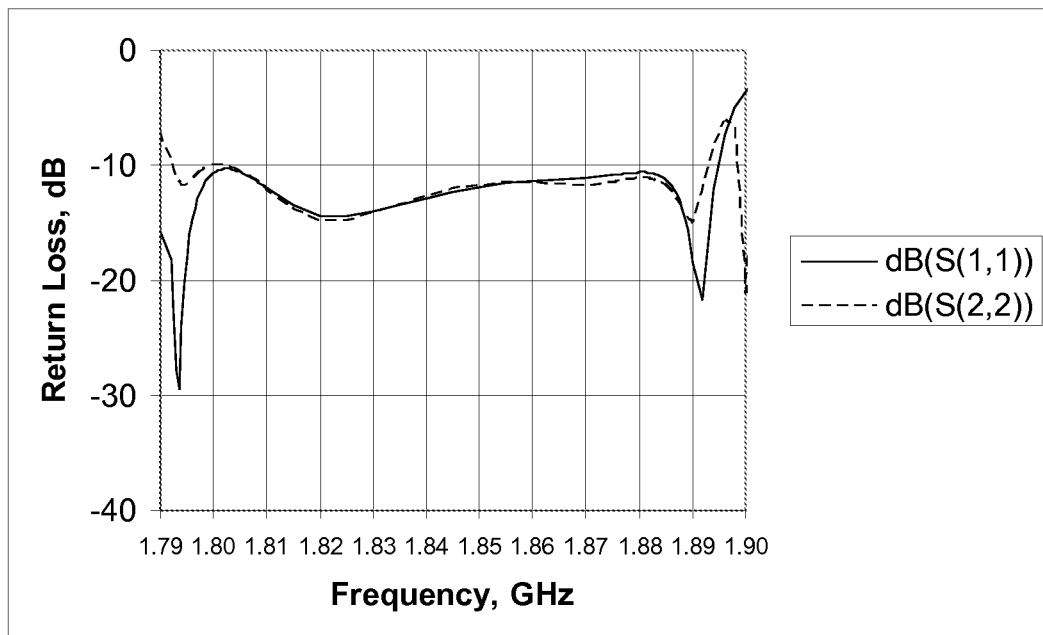

FIGS. 6A and 6B show the improvement in return loss of a BAW resonator filter, in spite of improvements in bandwidth indicated above, in accordance with various embodiments of the invention. FIG. 6A illustrates the return loss of a BAW filter that does not use blocker inductors 420, 450. As shown in the plot 610, three notches exist in the return loss across the passband resulting in poor return loss performance at frequencies around 1.809 GHz, 1.845 GHz and 1.878 GHz.

FIG. 6B is a return loss plot 620 for the BAW resonator filter having the first and second blocker inductors 420, 450. One skilled in the art will recognize that the return loss is more uniform across the passband and is about 0.5 dB better with the blocker inductors designing for higher bandwidth. Notice that without embodiments of this invention, typically designing for more bandwidth by increasing the frequency spacing between $F_s$ of the series and $F_p$ of the shunt resonators will degrade the return loss, especially in the middle of the passband.

Figure 7A:
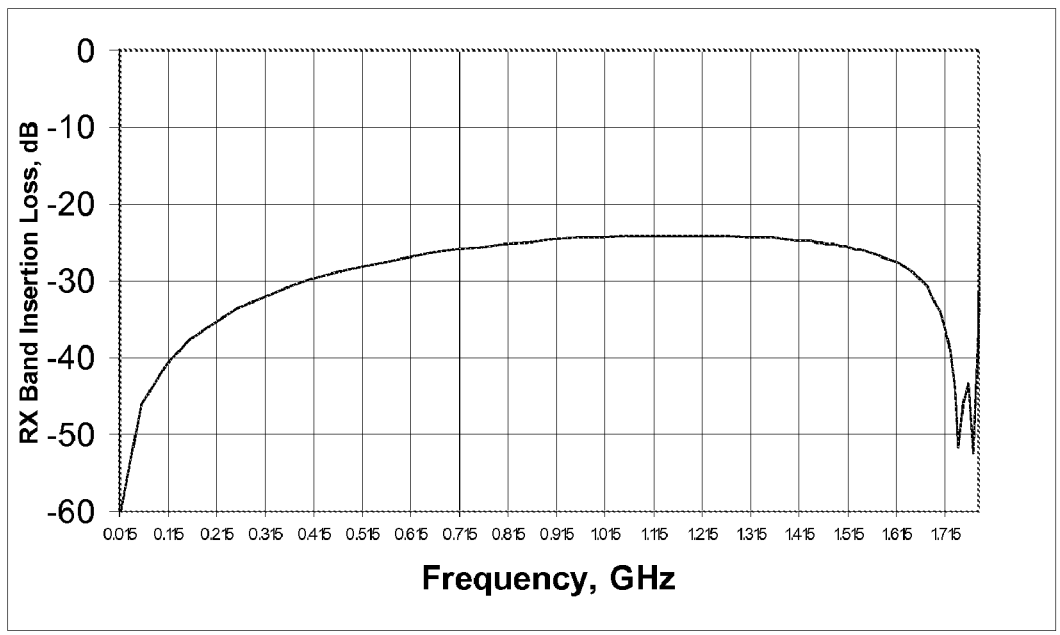
FIGS. 7A and 7B are representative plots of below-band rejection of a prior art BAW resonator filter and a BAW resonator filter with blocker inductors implemented in accordance with various embodiments of the invention.
Figure 7B:
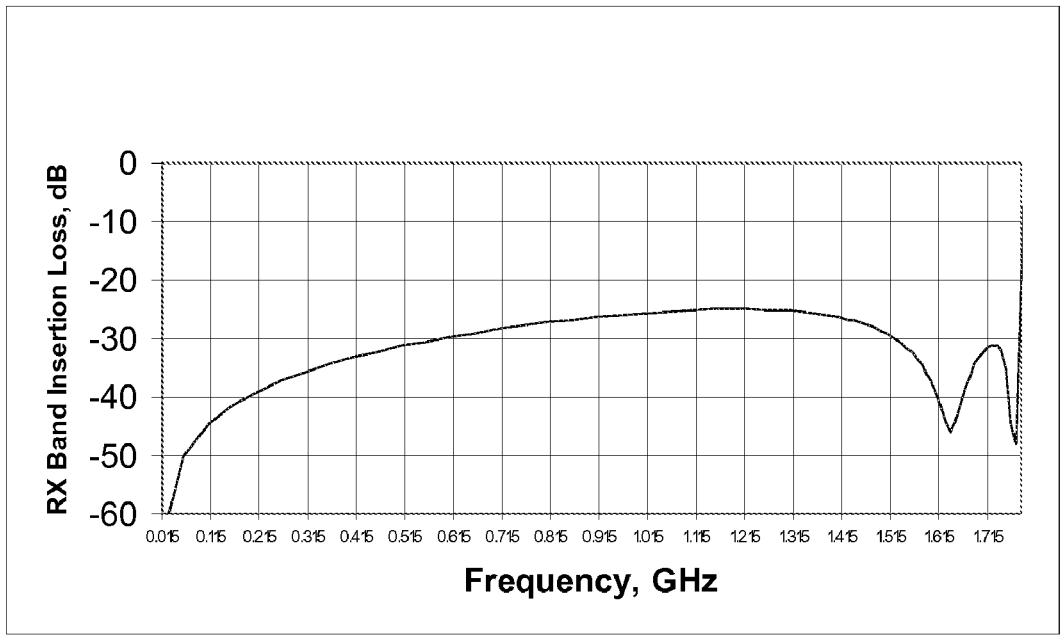

FIG. 7A and 7B show no substantial degradation in the attenuation of frequencies below the passband by the BAW resonator filter in accordance with various embodiments of the invention. FIG. 7A shows a plot 710 illustrating the out-of-band rejection for frequencies below the passband of the BAW resonator filter that does not have the first and second blocker inductors 420, 450. As shown, the attenuation on the signal is quite good around the bottom edge of the passband at around 1.725 GHz but returns to around 24 dB at frequencies below the notch.

FIG. 7B shows a plot 720 of the out-of-band rejection for frequencies below the passband of the BAW resonator filter that uses the first and second blocker inductors 420, 450 in accordance with various embodiments of the invention. As shown a second notch at around 1.65 GHz is created by slightly modifying the helper inductors to ensure similar attenuation of frequencies that are significantly below the passband to that achieved in a prior art implementations.

Figure 8A:
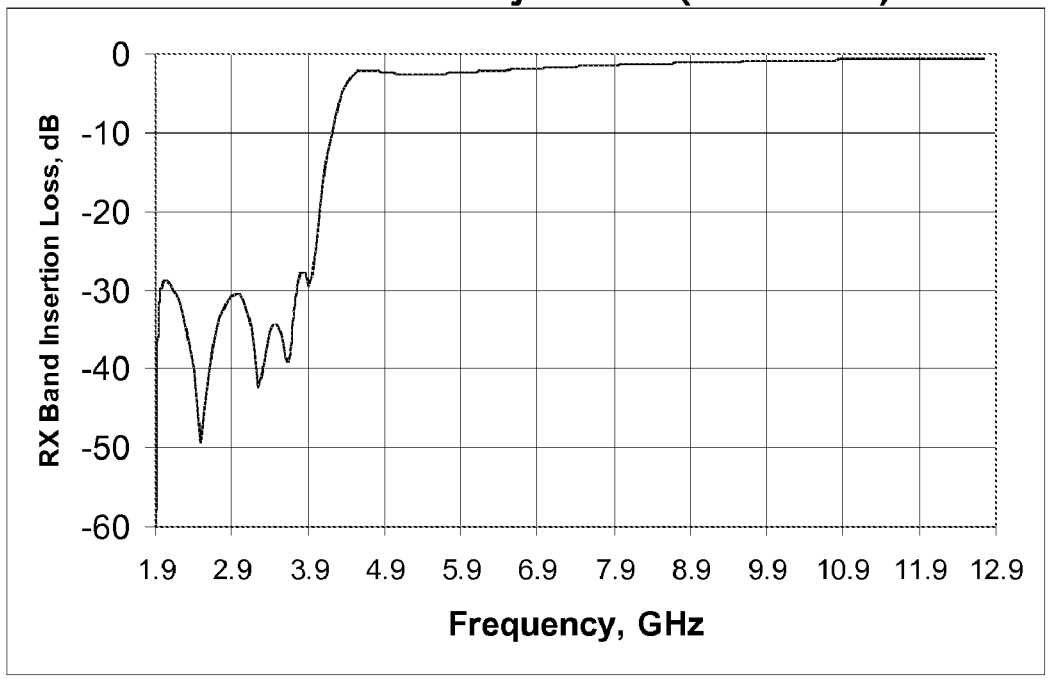
FIGS. 8A and 8B are representative plots of above-band rejection of a prior art BAW resonator filter and BAW resonator filter with blocker inductors implemented in accordance with various embodiments of the invention.
Figure 8B:
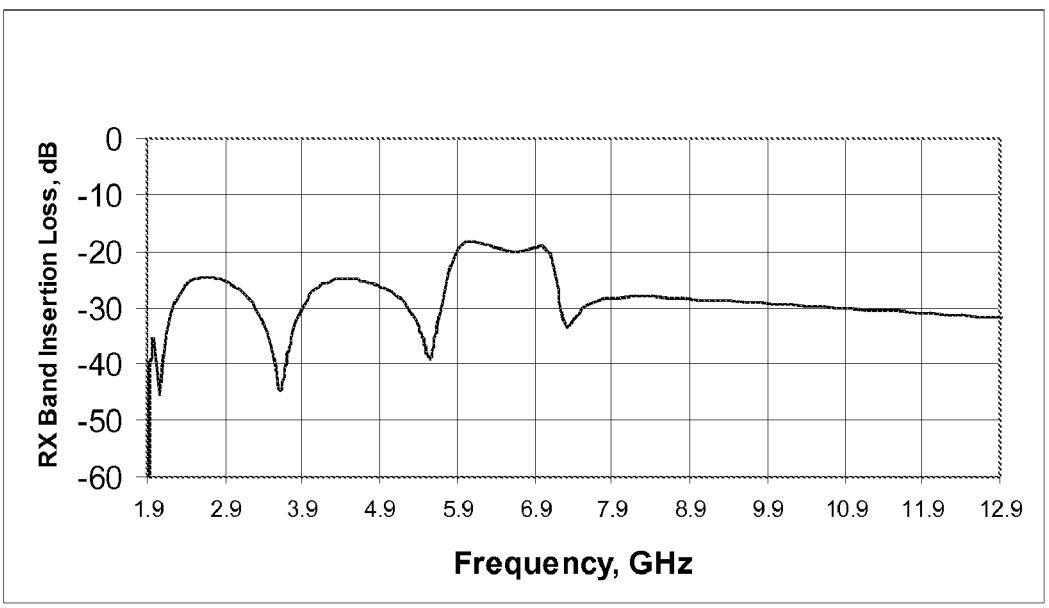

FIG. 8A and 8B show the improvement in the attenuation of frequencies above the passband by the BAW resonator filter in accordance with various embodiments of the invention. FIG. 8A shows a plot 810 illustrating the out-of-band rejection for frequencies above the passband of the BAW resonator filter that does not have the first and second blocker inductors 420, 450. As shown, the attenuation on the signal gradually decreases as the signal frequency increases and fails to provide sufficient attenuation for signal above 6 GHz.

FIG. 8B shows a plot 820 of the out-of-band rejection for frequencies above the passband of the BAW resonator filter that uses the first and second blocker inductors 420, 450 in accordance with various embodiments of the invention. As shown, attenuation of signals greater than 6 GHz is significantly greater than in the corresponding plot of FIG. 8A. In fact, the first and second block inductors 420, 450 cause the signal attenuation to increase as the signal frequency increases.

Figure 9A:
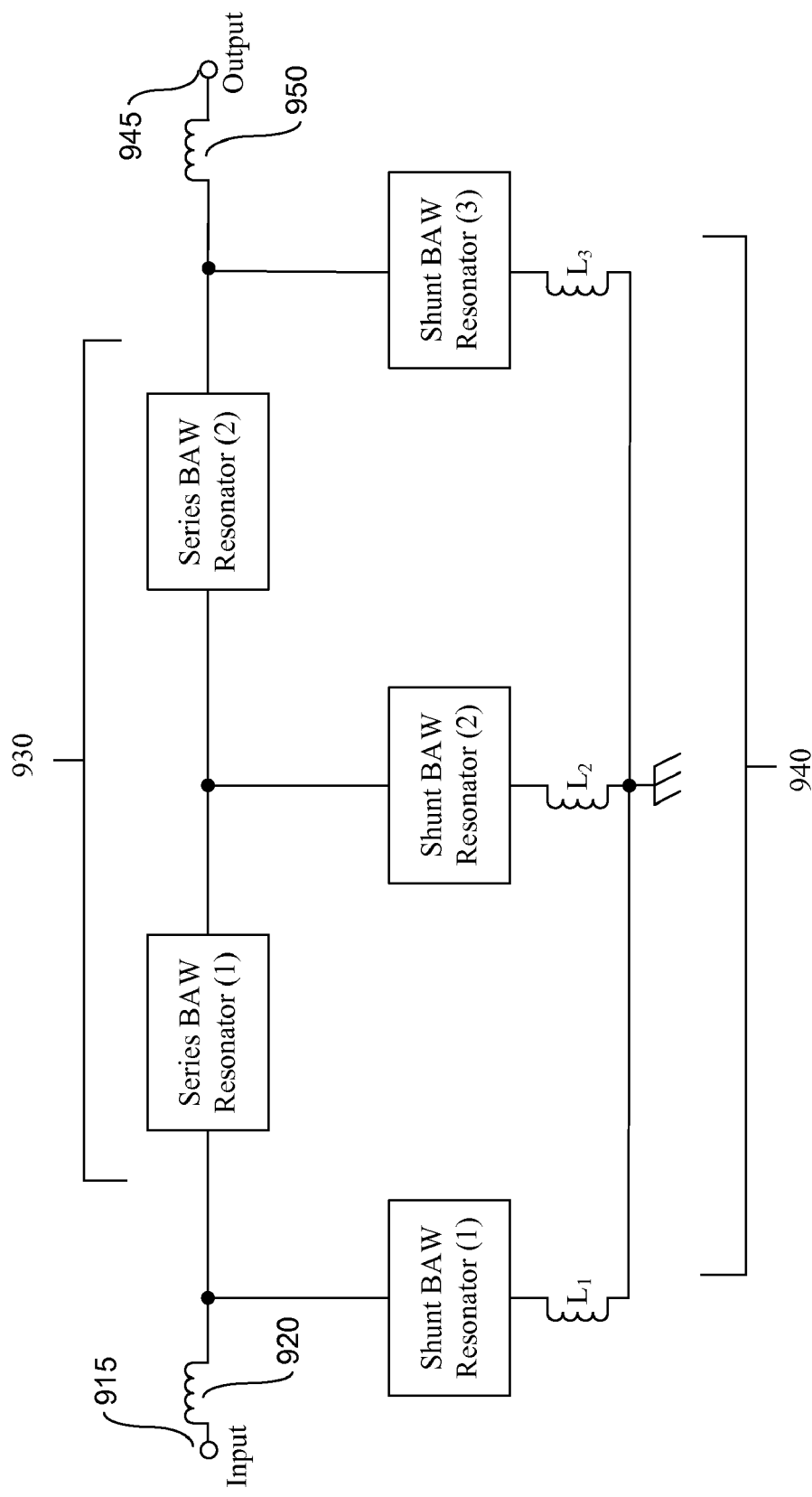
FIGS. 9A and 9B illustrate exemplary Pi resonator network filters including blocker inductors implemented in accordance with various embodiments of the invention.

FIG. 9A illustrates a Pi resonator network filter according to various embodiments of the invention. As illustrated, a plurality of series resonators 930 and a plurality of shunt resonators 940 are used to construct the Pi network. One or more helper inductors may also be included within the network. A first blocker inductor 920 is located between the input 915 of the filter and the first shunt BAW resonator. A second blocker inductor 950 is located between the output 945 and the third shunt BAW resonator.

The first and second blocker inductors 920, 950 function in the same manner above to improve rejection of high frequencies above the passband and expanding the bandwidth of the filter without significantly damaging the filter's insertion and return loss. One skilled in the art will recognize that the number of blocker inductors as well as their location within the serial path of the filter may be modified; all of which implementations are intended to fall within the scope of the present invention.

Figure 9B:
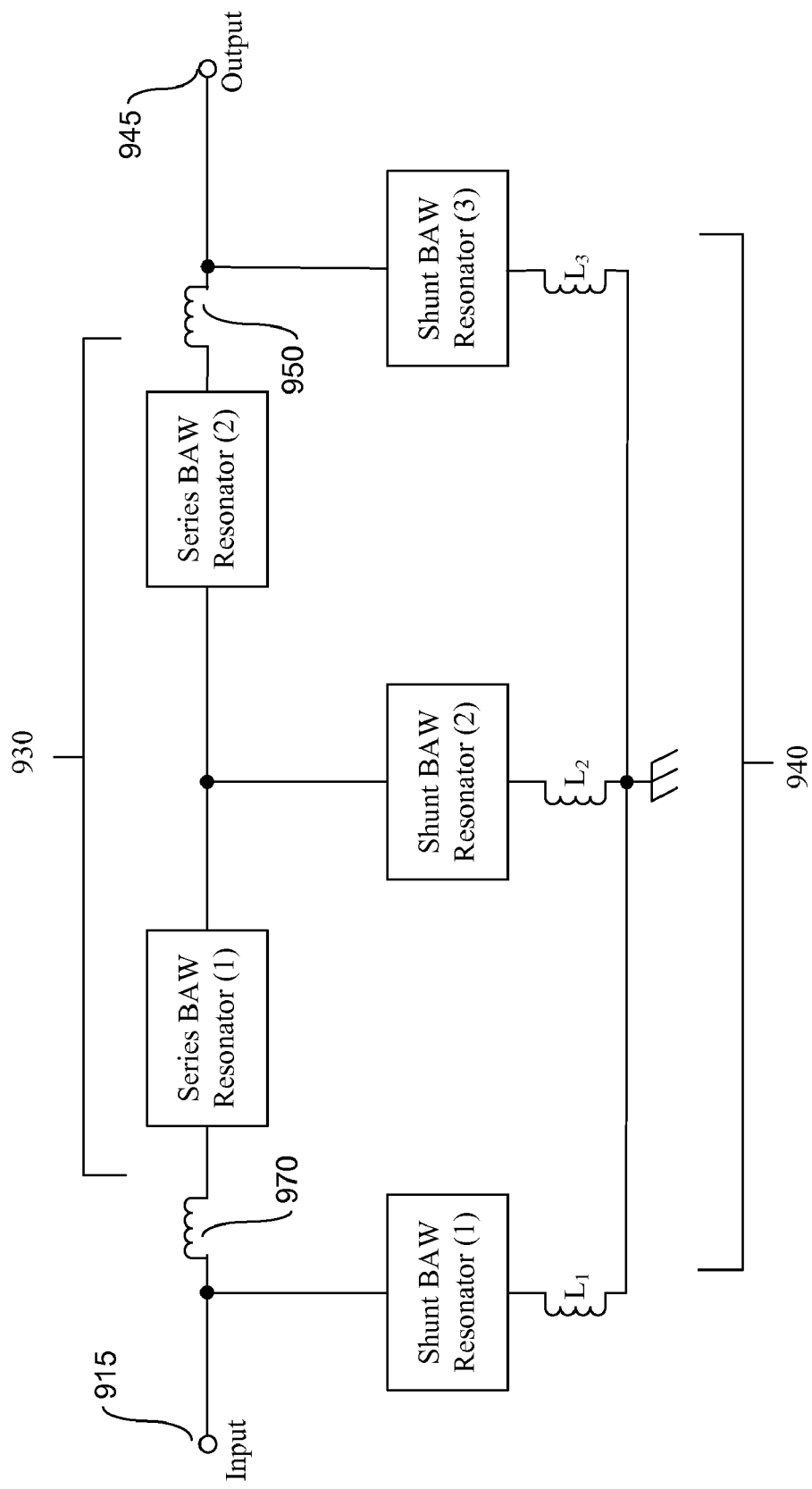

FIG. 9B illustrates one such modification in which the first and second blocker inductor locations are modified according to various embodiments of the invention. In particular, the first blocker inductor 970 is positioned between the first shunt BAW resonator and the first series BAW resonator and the second blocker inductor 980 is positioned between the second series BAW resonator and the third shunt BAW resonator.

One skilled in the art will recognize that mutual inductance may be a factor in the design of the BAW resonator filter using the blocker inductors. Accordingly, the approximate distance between the blocker inductors and the number and size of inductors may potentially adversely affect the response of the filter, and may be relevant in the design of a BAW resonator filter.

The use of inductors may also be applied to BAW resonator filters that have an impedance transformation across the filter for purposes of impedance matching. Examples of these impedance transforming BAW resonator filters are disclosed in U.S. patent application Ser. No. 11/471,031, entitled "Impedance Transformation and Filter Using Bulk Acoustic Wave Technology," filed Jun. 19, 2006, and in U.S. patent application Ser. No. 11/471,031, entitled "Impedance Transformation and Filter Using Bulk Acoustic Wave Technology," filed Jun. 19, 2006, both of which are incorporated by reference in their entirety. In particular, the blocker inductors may improve the insertion loss within the impedance transforming filter in which resonators are used that are limited to two BAW resonator thicknesses.

The blocker inductors may be integrated within a chip or may be an external component to the chip. For example, there may be certain instances where the inductance or the Q of the inductance of the blocker inductors may need to be sufficiently large so that external, discrete inductors would be more appropriate. These discrete inductors may be realized by designing the bond wire inductance as providing the blocker inductors. Surface mount inductors can provide very high Q as well, and can be suitable for use in this invention. One may also use inexpensive inductors processed in the protecting lid of the BAW cavity for SMR as blocker inductors.

The BAW resonator filters may be realized using different types of resonator technologies known to one of skill in the art including film bulk acoustic wave resonator ("FBAR"), solidly mounted resonators ("SMR"), and coupled resonator filters ("CRF"). Additionally, the BAW resonator filters using blocker inductors may be particularly relevant to aggressive bandwidth requirement such as CDMA filters.

The foregoing description of the invention has been described for purposes of clarity and understanding. It is not intended to limit the invention to the precise form disclosed. Various modifications may be possible within the scope and equivalence of the appended claims.

We claim:

1. A bulk acoustic wave ("BAW") resonator filter, comprising:
   an input of the BAW resonator filter for receiving an electrical signal;
   a first blocker inductor, coupled to the input, that increases a bandwidth associated with the BAW resonator filter and improves above-band frequency rejection by the BAW resonator filter;
   a first series BAW resonator, coupled to the first blocker inductor, that at least partially defines a series resonant path across the BAW resonator filter;
   a first shunt BAW resonator, coupled to an output of the first series BAW resonator, that at least partially defines a first shunt resonant path in the BAW resonator filter;
   a first helper inductor, coupled between the first shunt BAW resonator and ground, that defines a first additional resonant frequency that improves rejection of out-of-band frequencies in the BAW resonator filter;
   a second series BAW resonator, coupled between the first series BAW resonator and an output of the BAW resonator filter, that further at least partially defines the series resonant path across the BAW resonator filter; and
   a second blocker inductor, coupled between the second series BAW resonator and the output of the BAW resonator filter, that further increases the bandwidth associated with the BAW resonator filter and further improves out-of-band frequency rejection by the BAW resonator filter.

2. The BAW resonator filter of claim 1 further comprising:
   a second shunt BAW resonator, coupled to an output of the second series BAW resonator, that at least partially defines a second shunt resonant path in the BAW resonator filter;
   a second helper inductor, coupled between the second shunt BAW resonator and ground, that defines a second additional resonant frequency that further improves rejection of out-of-band frequencies in the BAW resonator filter; and
   a third series BAW resonator, coupled between the second series BAW resonator and the output of the BAW resonator filter, that further yet at least partially defines the series resonant path across the BAW resonator filter.

3. The BAW resonator filter of claim 1 wherein out-of-band frequency rejection is improved by the first and second helper inductors defining at least one additional frequency attenuation notch outside of the bandwidth of the BAW resonator filter.

4. The BAW resonator filter of claim 1 wherein a width of the bandwidth is improved relative to a ratio of an inductance of the first helper inductor and an inductance of a serial equivalent resonant inductor within the first BAW resonator.

5. The BAW resonator filter of claim 4 wherein the bandwidth is further improved relative to a ratio of an inductance of the second helper inductor and an inductance of a serial equivalent resonant inductor within the second BAW resonator.

6. The BAW resonator filter of claim 1 wherein the first and second blocker inductors are integrated within a chip comprising the BAW resonator filter or within a capping wafer.

7. The BAW resonator filter of claim 1 wherein the first and second blocker inductors are discrete components and external to a chip comprising the BAW resonator filter.

8. The BAW resonator filter of claim 7 wherein the first and second blocker inductors are realized by bond wires communicatively coupled to the chip.

9. The BAW resonator filter of claim 1 wherein the first and second series BAW resonators and the first shunt BAW resonator are manufactured using solidly mounted resonator technology.

10. The BAW resonator filter of claim 1 wherein the first and second series BAW resonators and the first shunt BAW resonator are manufactured using thin film bulk acoustic resonator technology.

11. The BAW resonator filter of claim 1 wherein an impedance transformation occurs between the input and output of the BAW resonator filter.

12. The BAW resonator filter of claim 11 wherein a maximum of two resonator thicknesses are used in the manufacturing of the first and second series BAW resonators and the first shunt BAW resonator.

13. The BAW resonator filter of claim 1 wherein the BAW resonator filter is used within a WCDMA or UMTS or GSM device and the first and second blocker inductors provide additional attenuation of signal frequencies above 6 GHz.

14. A method for enhancing a passband in a BAW resonator filter and improving rejection of signals outside of the passband, the method comprising:

creating a high frequency low pass response within the BAW resonator filter transfer function by coupling a first blocker inductor within a resonant series path;

creating a high frequency low pass response within the BAW resonator filter transfer function by coupling a second blocker inductor within the resonant series path;

shifting at least one edge of the passband in the BAW resonator filter in accordance with a ratio of an inductance of the first blocker inductor and a serial resonant inductance of a first BAW resonator within the resonant series path; and further shifting the at least one edge of the passband in the BAW resonator filter in accordance with a ratio of an inductance of the second blocker inductor and a serial resonant inductance of a second BAW resonator within the resonant series path.

15. The method of claim 14 wherein the first and second blocker inductors are integrated components within an integrated BAW resonator filter.

16. The method of claim 14 wherein the first and second blocker inductors are discrete components and external to an integrated BAW resonator filter.

17. The method of claim 14 wherein the first and second blocker inductors reduce gain of frequency signals above a desired frequency threshold.

18. The method of claim 14 wherein the shifting of the at least one edge of the passband in the BAW resonator filter is defined by $SQRT(1+(L_{first\ blocker\ inductor}/L_{serial\ resonant\ inductance\ of\ the\ first\ BAW\ resonator}))$.

19. The method of claim 14 wherein the further shifting of the at least one edge of the passband in the BAW resonator filter is defined by $SQRT(1+(L_{second\ blocker\ inductor}/L_{serial\ resonant\ inductance\ of\ the\ second\ BAW\ resonator}))$.

20. The method of claim 14 wherein an impedance transformation occurs between an input and output of the BAW resonator filter.

21. The method of claim 20 wherein a maximum of two resonator thicknesses are used in the manufacturing of BAW resonators within the BAW resonator filter.

22. The method of claim 20 wherein more than two resonator thicknesses are used in the manufacturing of BAW resonators within the BAW resonator filter.

23. A BAW resonator filter comprising:
a serial resonant path, coupled between an input and an output of the BAW resonator filter, having a plurality of serial BAW resonators that at least partially define a passband of the BAW resonator filter;
at least one shunt resonant path, coupled between the serial resonant path and ground, having at least one shunt BAW resonators that at least partially define an upper edge of the passband of the BAW resonator filter;
a plurality of blocker inductors, coupled within the serial resonant path, that improve rejection of signal frequencies outside of the passband and expand a width of the passband; and
wherein the width of the passband is improved relative to a ratio of an inductance of a helper inductor within the plurality of helper inductors and an inductance of a serial resonant inductor within the BAW resonator in the plurality of serial BAW resonators.

24. The BAW resonator filter of claim 23 wherein the serial resonant path comprises three serial BAW resonators, a first blocker inductor coupled at the input, and a second blocker inductor coupled at the output.

25. The BAW resonator filter of claim 23 wherein an impedance transformation occurs between the input and output of the BAW resonator filter.

26. The BAW resonator filter of claim 25 wherein a maximum of two resonator thicknesses are used in the manufacturing of the plurality of serial BAW resonator and at least one shunt BAW resonator.

27. The BAW resonator filter of claim 25 wherein more than two resonator thicknesses are used in the manufacturing of the plurality of serial BAW resonator and at least one shunt BAW resonator.

28. The BAW resonator filter of claim 23 wherein the plurality of serial BAW resonators and the at least one shunt BAW resonator are manufactured using solidly mounted resonator technology.

29. The BAW resonator filter of claim 23 wherein the plurality of serial BAW resonators and the at least one shunt BAW resonator are manufactured using thin film bulk acoustic resonator technology.

30. A bulk acoustic wave ("BAW") Pi network resonator filter, comprising:
an input of the BAW Pi network resonator filter for receiving an electrical signal;
a serial path comprising at least two series BAW resonators that are coupled between the input and an output of the BAW Pi network resonator filter;
a first blocker inductor, coupled within the serial path, that increases a bandwidth associated with the BAW Pi network resonator filter and improves above-band frequency rejection by the BAW Pi network resonator filter;
a plurality of shunt BAW resonator paths, each shunt BAW resonator path being coupled between the serial path and ground, and wherein at least one of the plurality of shunt BAW resonator paths comprises both a BAW resonator and a helper inductor; and
wherein a passband width associated with the serial path and the plurality of shunt paths is improved relative to a ratio of an inductance of the helper inductor and an inductance of a serial resonant inductor within the serial path.

31. The BAW Pi network resonator filter of claim 30 further comprising a second blocker inductor coupled within the serial path.

32. The BAW Pi network resonator filter of claim 31 wherein the second blocker inductor is coupled directly to the output of the filter.

33. The BAW Pi network resonator filter of claim 31 wherein the first blocker inductor is coupled directly to the input of the filter.

34. The BAW Pi network resonator filter of claim 30 wherein the first and second blocker inductors are integrated within a chip comprising the BAW resonator filter.

35. The BAW Pi network Pi network resonator filter of claim 30 wherein the first and second blocker inductors are discrete components and external to a chip comprising the BAW resonator filter.

36. The BAW Pi network resonator filter of claim 35 wherein the first and second blocker inductors are realized by bond wires communicatively coupled to the chip.

37. The BAW Pi network resonator filter of claim 30 wherein at least one BAW resonator within the filter is manufactured using solidly mounted resonator technology.

38. The BAW Pi network resonator filter of claim 30 wherein at least one BAW resonator within the filter is manufactured using thin film bulk acoustic resonator technology.

39. The BAW Pi network resonator filter of claim 30 wherein at least one BAW resonator within the filter is manufactured using coupled resonator filter technology.

40. The BAW Pi network resonator filter of claim 30 wherein an impedance transformation occurs between the input and output of the BAW resonator filter.

41. The BAW Pi network resonator filter of claim 40 wherein more than two resonator thicknesses are used in the manufacturing of BAW resonators within the filter.

42. The BAW Pi network resonator filter of claim 40 wherein a maximum of two resonator thicknesses are used in the manufacturing of BAW resonators within the filter.

* * * * *